(12) United States Patent
Jiang et al.

(10) Patent No.: US 8,368,174 B1
(45) Date of Patent: Feb. 5, 2013

(54) COMPENSATION NETWORK USING AN ON-DIE COMPENSATION INDUCTOR

(75) Inventors: Xiaohong Jiang, San Jose, CA (US); Hong Shi, Fremont, CA (US)

(73) Assignee: Altera Corporation, San Jose, CA (US)

( * ) Notice: Subject to any disclaimer, the term of this patent is extended or adjusted under 35 U.S.C. 154(b) by 131 days.

(21) Appl. No.: 12/833,888

(22) Filed: Jul. 9, 2010

(51) Int. Cl.
*H01L 27/08* (2006.01)

(52) U.S. Cl. ........................................................ 257/531

(58) Field of Classification Search ........... 257/E23.004, 257/E23.043–E23.05, 41, 81, 82, 91, 99, 257/177–182, 276, 666–667, E23.031–E23.059, 257/678–733, 787–796, E23.001–E23.194, 257/772, 779, E23.015, E23.02, E23.023–E23.079, 257/E21.508–E21.509, E21.519, 622–626, 257/773–776, E21.575–E21.597, E21.627, 257/E21.641, E21.022, 277, 530–533; 438/111, 438/115, 123, 643–685, 612–617; 716/137
See application file for complete search history.

(56) References Cited

U.S. PATENT DOCUMENTS

| | | | |
|---|---|---|---|
| 7,404,249 B2 * | 7/2008 | Gardes et al. | 29/602.1 |
| 7,859,080 B2 * | 12/2010 | Kuwajima et al. | 257/531 |
| 7,968,968 B2 * | 6/2011 | Wang et al. | 257/531 |
| 2003/0127704 A1 * | 7/2003 | Kobayashi et al. | 257/531 |
| 2003/0231093 A1 * | 12/2003 | Hsu et al. | 336/200 |
| 2005/0099244 A1 * | 5/2005 | Nakamura et al. | 333/133 |
| 2005/0099260 A1 * | 5/2005 | Ahn et al. | 336/223 |
| 2005/0194350 A1 * | 9/2005 | Hsieh et al. | 216/13 |
| 2008/0122029 A1 * | 5/2008 | Wang et al. | 257/531 |
| 2008/0290457 A1 * | 11/2008 | Ker et al. | 257/531 |
| 2010/0096725 A1 * | 4/2010 | Shi et al. | 257/531 |

OTHER PUBLICATIONS

Hsiao et al., ong Pad Desgin with Low capacitance in CMOS Technology for RF Applications, IEEE Electron Device letters, vol. 28, No. 1, Jan. 2007.*

Hsiao et al., Bond Pad Design With Low Capacitance in CMOS Technology for RF Applications, IEEE Electron Device Letters, vol. 28, No. 1, Jan. 2007.

* cited by examiner

*Primary Examiner* — Dao H Nguyen
*Assistant Examiner* — Tram H Nguyen
(74) *Attorney, Agent, or Firm* — Womble Carlyle Sandridge & Rice, LLP

(57) ABSTRACT

An integrated circuit with an on-die compensation network is presented. The compensation network includes a compensation inductor that has one terminal coupled to a bump pad of the die. Another terminal of the inductor is connected to a metal layer underneath the compensation inductor, forming a pi-configuration with the bump pad. The metal layer routes input and output signals from the integrated circuit. The invention can be used in either flip chip or wire bond applications.

20 Claims, 6 Drawing Sheets

COMPENSATION NETWORK USING AN ON-DIE COMPENSATION INDUCTOR

BACKGROUND

Input signals and power are provided to an integrated circuit from a semiconductor package (either flip-chip or wirebond or package, flip chip package is our example for illustration here) through a series of bump pads. Capacitance associated with these bump pads is known to introduce significant discontinuities at a die-package interface. These discontinuities greatly degrade the system performance, so that even if the package and associated printed circuit board (PCB) are well-designed, the return loss of the system can be degraded by up to 10 decibels (dB) and the insertion loss up to 5 dB. If the system loss is large enough, the system loss can lead to possible system specification violations, and the overall system will not deliver the specified amount of performance.

Traditional methods used to mitigate the effect of the bump pad capacitance of the integrated circuit are often implemented either on the package or the printed circuit board. Methods implemented on the PCB generally rely on the use of long metal traces to dampen the amount of system return loss, in order to meet protocol return loss specification. At best, the use of long metal traces can be considered a work around methodology, as the metal traces introduce a large amount of attenuation to the system. Compensation methods on the package generally involve the use of an intrinsic package structure to reduce the amount of system loss. The on-package capacitive parasitics can be translated into inductive parasitics through a quarter wavelength transmission line, which as a result, balance the bump pad capacitance. A significant drawback of these methods is the compensation is effective in a narrow frequency band and is data rate dependent. In other words, the compensation from the methods described above is only effective over a small range of frequencies.

It is in this context that embodiments of the invention arise.

SUMMARY

Broadly speaking, the present invention fills these needs by providing a method and apparatus for minimizing the discontinuity at a die-package interface using an on-die compensation inductor. In one embodiment, the bump pad with the compensation inductor provides broadband compensation of the bump pad capacitance. It should be appreciated that the present invention can be implemented in numerous ways, including as a method, a system, or a device. Several inventive embodiments of the present invention are described below.

In accordance with one aspect of the invention, an integrated circuit with an on-die compensation network is detailed. The compensation network includes a compensation inductor that has one terminal coupled to a bump pad of the die. Another terminal of the compensation inductor is connected to a metal layer underneath the inductor, forming a pi-configuration with the bump pad. The metal layer routes input and output signals from the circuits of the die to the bump pads.

In accordance with another aspect of the invention, a method of designing an integrated circuit using an on-die compensation network is provided. The method begins with capacitive and inductive impedance values associated with the printed circuit board and with a package being determined. Next, a capacitive impedance value of a bump pad and a capacitive impedance value of metal layers that route input and output signals from the integrated circuit design are determined. The size of a compensation inductor is calculated according to the impedance values of the printed circuit board, the package, the bump pad of the integrated circuit, and the metal layer of the integrated circuit. A compensation inductor is coupled in a pi-configuration to the bump pad and the metal layer of the integrated circuit design, as well as to other passive components of the system. The design is then stored for subsequent manufacturing of an integrated circuit.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

The following embodiments describe an apparatus and method for minimizing the discontinuity at a die-package interface using an on-die compensation inductor. It will be obvious, however, to one skilled in the art, that the present invention may be practiced without some or all of these specific details. In other instances, well known process operations have not been described in detail in order not to unnecessarily obscure the present invention.

Figure 1A:
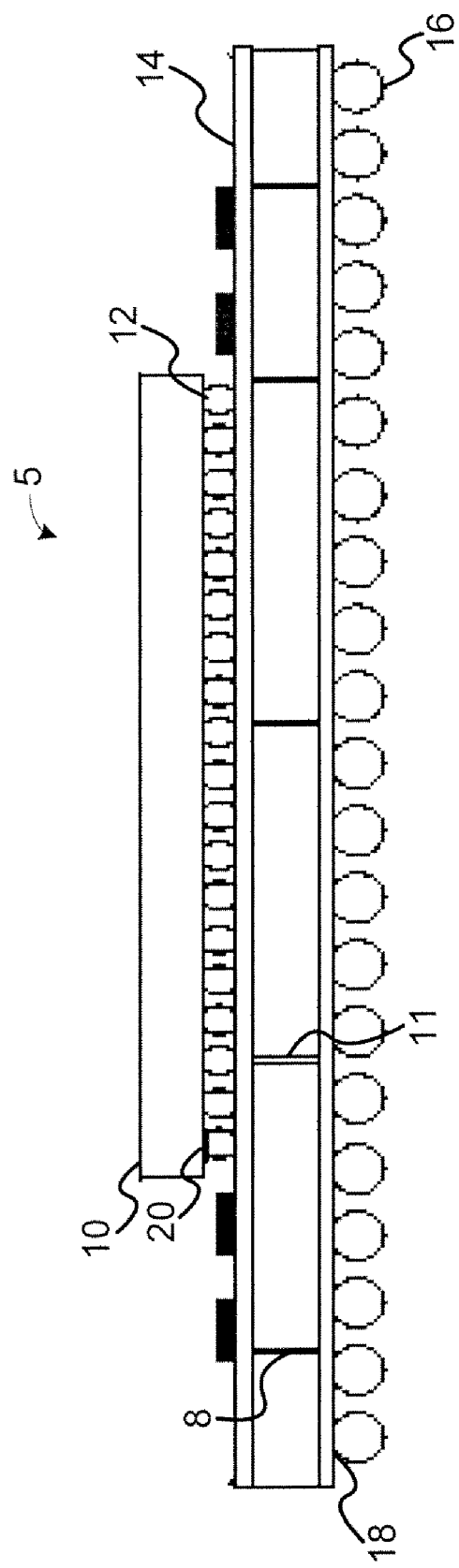
FIG. 1A illustrates a cross-sectional view of a die-package configuration that can include aspects of the present invention.

FIG. 1A illustrates a cross-sectional view of a flip-chip die-package configuration that can include aspects of the present invention. Integrated circuit (IC) or die 10 is configured to transmit output signals and receive input signals and power through a number of bump pads 20 disposed on a top surface. The bump pads 20 in turn are connected to a number of solder bumps 12 disposed on a top surface of semiconductor circuit package 14. In one embodiment, the die 10 can also be connected to the package 14 through use of a bond wire (not shown) that couples to bond pads on the top surface of the die 10 to the top surface of the package 14, where the bottom surface of the die 10 is mounted on the top surface of the package 14.

Figure 1B:
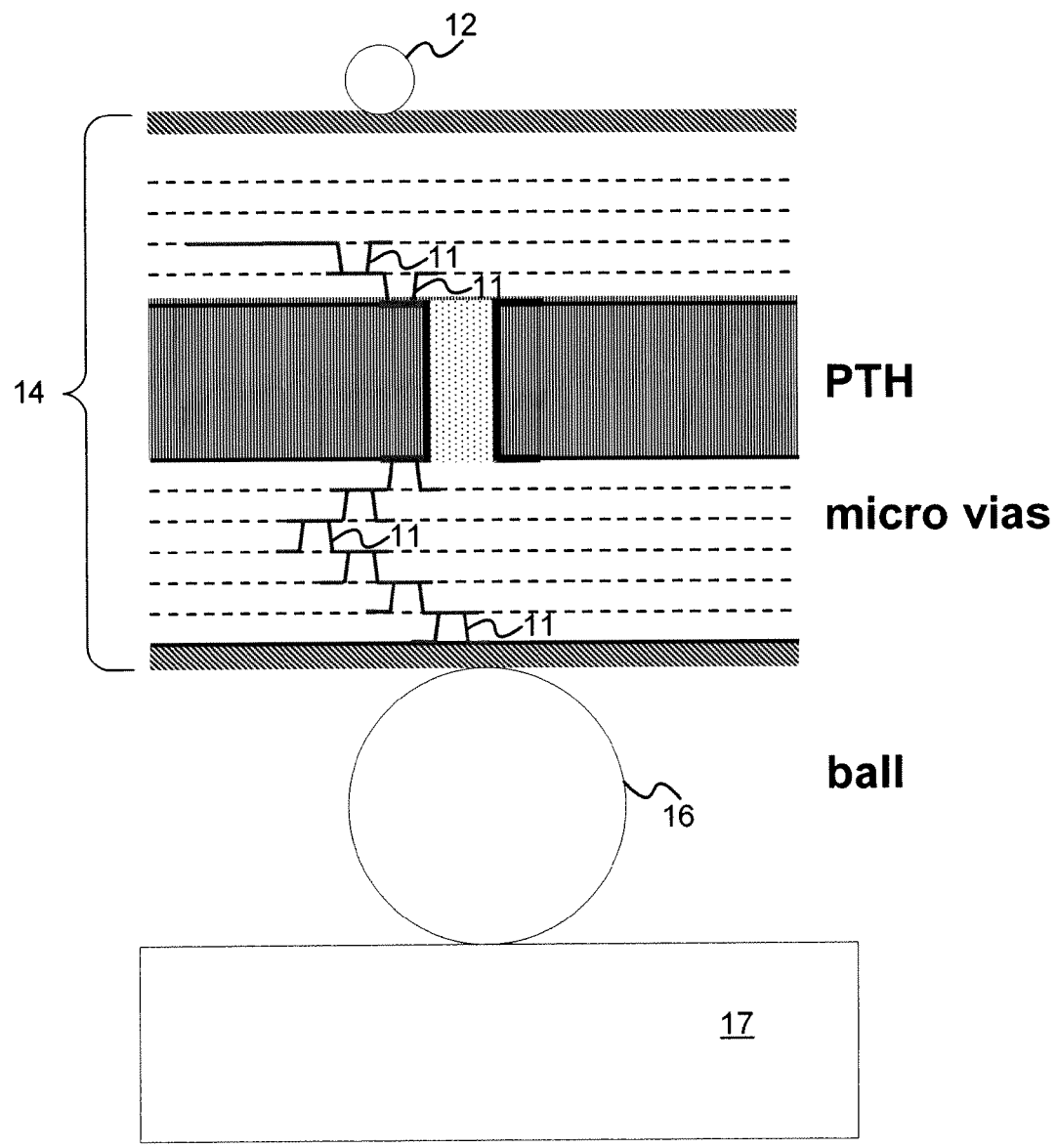
FIG. 1B illustrates a cross-sectional view of a package configuration that can include aspects of the present invention.

FIG. 1B illustrates a cross-sectional view of a package configuration that can include aspects of the present invention. Signals are routed from the solder bumps 12 either through metal traces (microstrip line not shown) on the top surface of the package 14, or through strip-lines on the intermedium layer of the package 14. Signals from the traces of the package 14 are then carried by micro-vias 11 and plated through holes (PTHs) 8 of the package 14 to the solder balls 16 on an opposing surface of the package 14. In this way, signals to and from the die 10 are transmitted to a printed circuit board (PCB) 17 through solder balls 16 that are attached to ball pads 18 (not shown) on a top surface of the PCB 17. Embodiments described below provide a network for compensating die pin capacitance in a die-package system to reduce system return loss and insertion loss that is effective over a broad range of frequencies. In one embodiment, the compensation is implemented through a compensation inductor on the die 10 located underneath a bump pad 20, which reduces system loss of the transceiver channels for high frequency applications.

Figure 2:
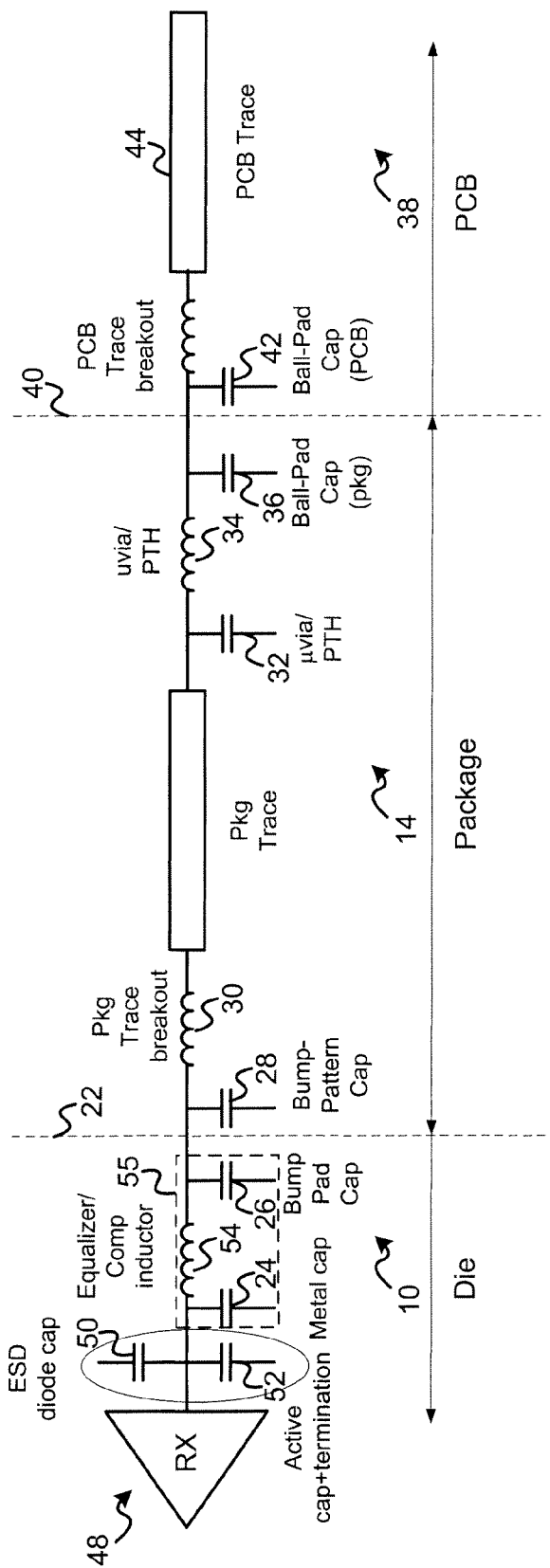
FIG. 2 illustrates an equivalent circuit of a die-package system with an on-die compensation inductor, in accordance with one embodiment of the present invention.

FIG. 2 illustrates an equivalent circuit of a die-package-PCB system with an on-die compensation inductor, in accordance with one embodiment of the present invention. As discussed above, signals that travel from the die 10 to the package 14 experience both insertion loss and return loss at the interface 22 between the die 10 and the package 14. These losses are due to the impedance mismatch between the die 10 and package 14. One skilled in the art will appreciate the die-package-PCB system, illustrated in FIG. 2, is designed to operate in a 50 ohm (Ω) impedance environment. In such a system, excessive capacitance in the die 10 is a significant component of the impedance mismatch at the die-package interface 22.

Embodiments described below may be implemented in the receiver channel 48 of the die-package-PCB system, where the capacitance of the die 10 arises from two primary sources, the capacitance of the metal 24 used to route input/output (I/O) signals from the die 10 to the bump pads, and the capacitance from the bump pad 26. The capacitance from the bump pad 26 arises between the metal of the bump pad and the metal routing of the die 10. In one embodiment, the capacitances of the bump pad and metal routing represent the capacitive impedance of the die 10, and the inductance of the compensation inductor 54 represents the inductive impedance of the die 10. One with skill in the art will appreciate placing the compensation inductor 54 underneath the bump pad to form a pi-configuration 55 between the compensation inductor 54 and the capacitances of the metal 24 and the bump pad 26 in the receiver channel 48. Inductive and capacitive parasitics in the package 14 and PCB 38, together with the on-die parasitics describes the complete die-package-PCB system performance. In one embodiment, the compensation inductor 54 has a value to balancing the system impedance, and creates a 50Ω impedance at die-package interface 22 over a certain frequency range. In this fashion, the impedance mismatch at the die-package interface 22 is minimized and the most significant discontinuity in the die-package-PCB system is eliminated.

On the package 14 side of the die-package interface 22, the impedance mismatch is caused by discontinuity of physical dimensions within the package 14, and can be represented by several components of capacitance and inductance illustrated in FIG. 2. In one embodiment, the discontinuity arises from the horizontal transmission line, the vertical transition of signals through micro-vias, PTHs, and ball grid array (BGA) solder balls, layer to layer coupling between adjacent layers of the package 14, and the horizontal to vertical transition of signals on the package 14. These discontinuities can be described as capacitance from the bump pattern 28 that receives the solder bump on the package 14, inductance from the metal traces on the package 30, capacitance 32 and inductance 34 from the micro-vias and PTHs, and capacitance of the solder ball pad 36, as well as using a package 14 trace model.

Ideally, the on-die compensation network would also compensate for any impedance discontinuity at the interface 40 between the package 14 and the PCB 38. The components of the impedance mismatch on the PCB 38 include the capacitance 42 of the PCB ball pads that couples the solder ball to the PCB 38, as well as an inductance 44 from the PCB trace breakout between the PCB landing pad and the PCB transmission line 44. The on-die capacitive impedance on the receiver channel 48 of the die-package-PCB system also includes capacitance 50 from electrostatic discharge (ESD) diodes, and an active capacitance and termination element 52. In one embodiment, the various capacitances and inductances of the package 14 and the PCB 38, shown in FIG. 2, represent the capacitive and inductive impedances of the package 14 and PCB 38.

Figure 3:
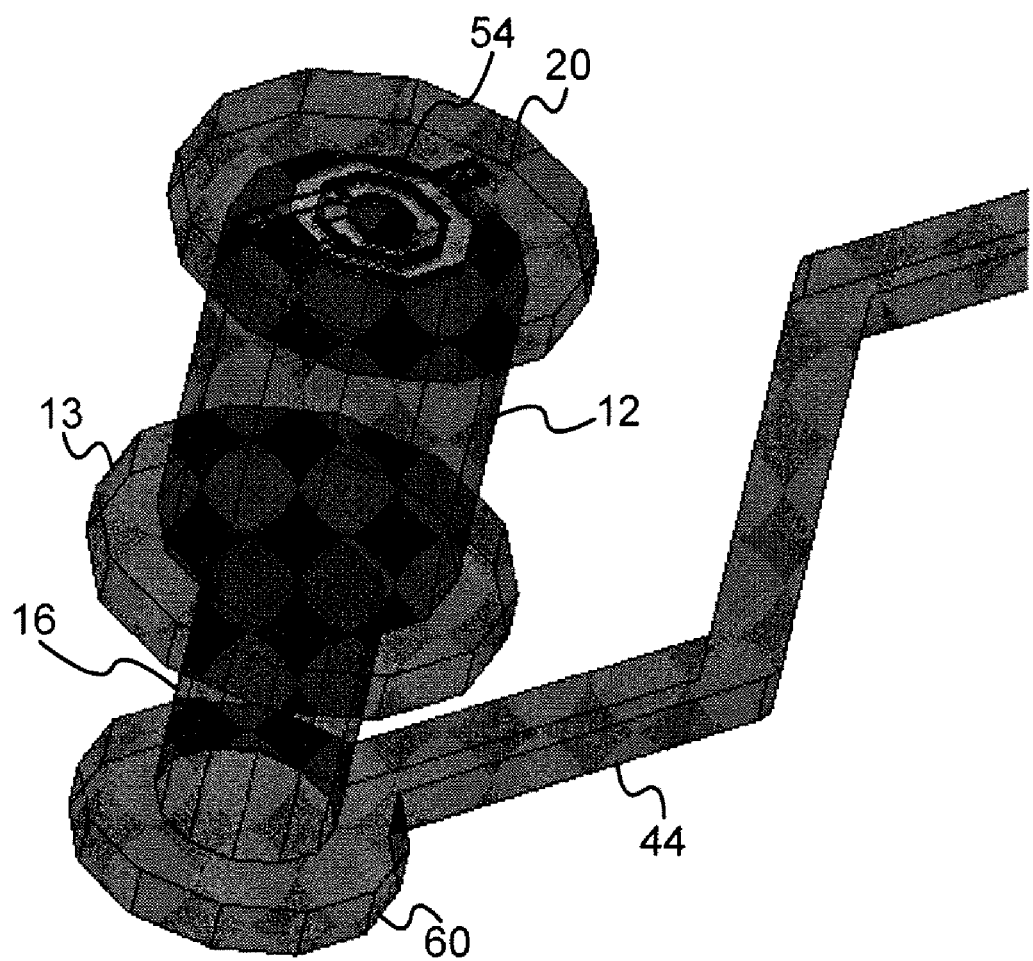
FIG. 3 illustrates a simplified physical structure of a compensation network using an on-die compensation inductor, in accordance with one embodiment of the present invention.

FIG. 3 illustrates a simplified physical structure of a compensation network using an on-die compensation inductor, in accordance with one embodiment of the present invention. As discussed above, an on-die compensation network minimizes the impedance discontinuity at the die/package interface. One such network introduces a compensation inductor 54 connected to a bump pad 20 of the die. In one embodiment, the compensation inductor 54 is located underneath the bump pad 20, and in another embodiment, the compensation inductor 54 is configured as a spiral inductor. As discussed above, the signal propagates to the die through the package transmission line 44, via 16 and solder bump 12. One with skill in the art will appreciate the total inductance of a spiral inductor is determined by several factors such as metal line width, metal line spacing, the number of turns in the inductor and the thickness of the metal line.

In one embodiment, the compensation inductor 54 is formed using an existing metal layer that is closest to the metal layer of the bump pad 20 of the die. In another embodiment, the compensation inductor 54 is implemented using multiple metal layers depending on the inductance value needed to compensate for the die-package impedance discontinuity. Still further, the diameter of the compensation inductor 54 is less than the diameter of the bump pad 20 of the die, in one embodiment, hence the inductor does not take extra space underneath the bump pad 20. With the compensation inductor 54 implemented as a spiral underneath a bump pad 20, the compensation inductor 54 consumes little on-die space.

Figure 4A:
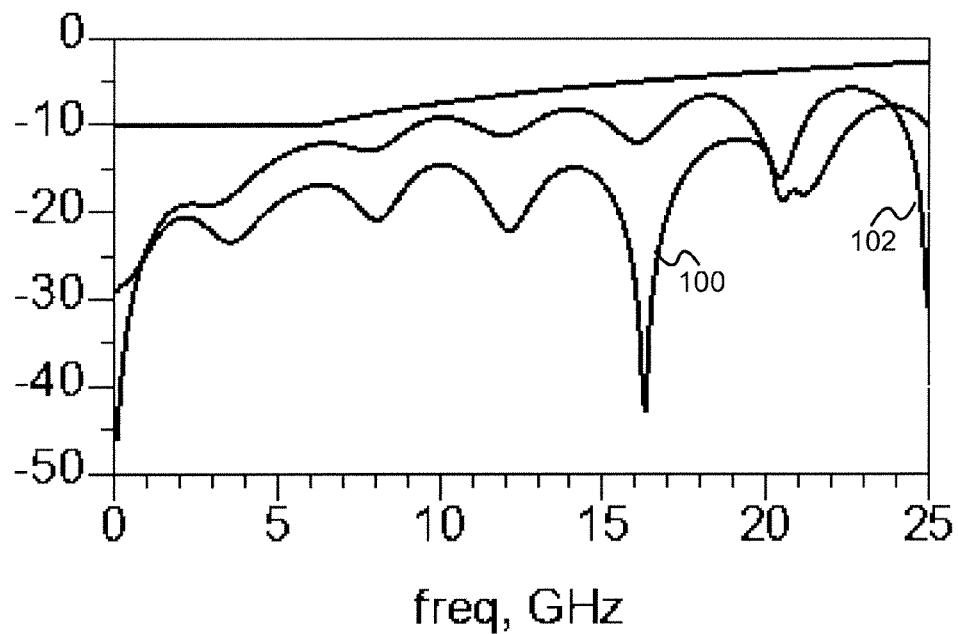
FIG. 4A illustrates a calculation of the return loss over a frequency range, in accordance with one embodiment of the present invention.

FIG. 4A illustrates a calculation of the return loss over a frequency range, in accordance with one embodiment of the present invention. The compensation network using a compensation inductor, illustrated in FIG. 3, reduces the return loss as a function of frequency as compared to the uncompensated die/package system. As illustrated in FIG. 4A, the die-package system implemented using the compensation inductor compensation network, illustrated by the line 100, has a calculated return loss reduction of an average of 5 decibels (dB) for frequencies up to 20 gigahertz (GHz) compared to the uncompensated die-package system, illustrated by the line 102.

Figure 4B:
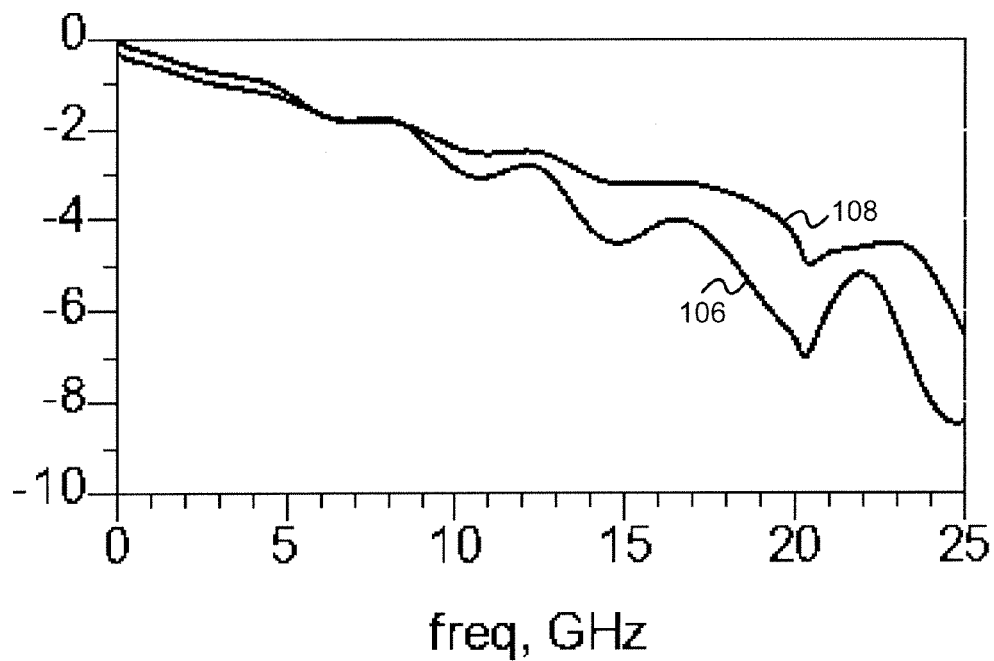
FIG. 4B illustrates a calculation of the insertion loss over a frequency range, in accordance with one embodiment of the present invention.

FIG. 4B illustrates a calculation of the insertion loss over a frequency range, in accordance with one embodiment of the present invention. As illustrated in FIG. 4B, the die/package system utilizing the compensation inductor compensation network reduces the insertion loss, illustrated by the line 108, by an average of 2-3 dB up to 20 GHz compared to the uncompensated die-package system, illustrated by the line 106. One with skill in the art will appreciate the improvement of the simulated return loss and insertion using the compensation network is achieved over substantially the entire range of frequencies.

Figure 5:
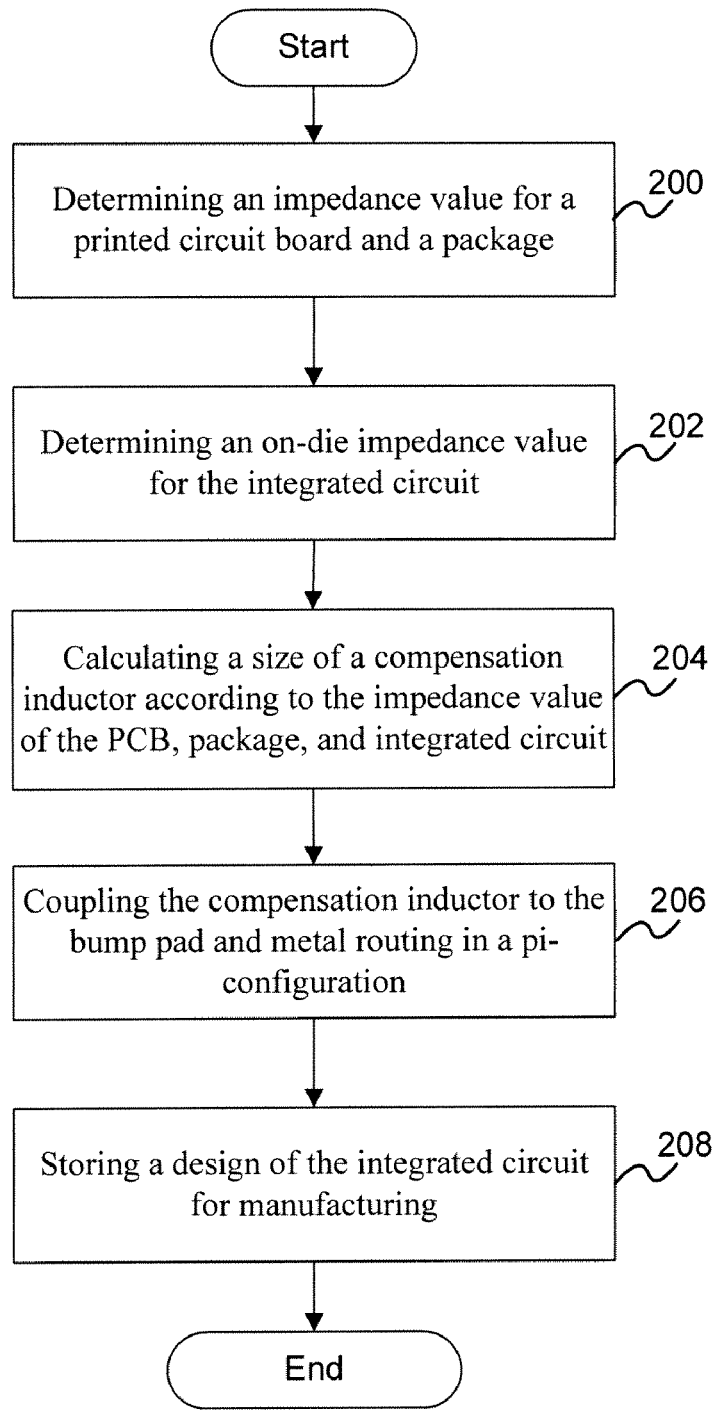
FIG. 5 is a flow chart diagram illustrating method operations for designing an integrated circuit with an on-die compensation network, in accordance with one embodiment of the present invention.

FIG. 5 is a flow chart diagram illustrating method operations for designing an integrated circuit with an on-die compensation network, in accordance with one embodiment of the present invention. The method begins with operation 200, where the impedance values of the package and PCB are determined. In one embodiment, the package is described by an inductive and capacitive impedance, as well as a transmission line model, as illustrated in FIG. 2. In another embodiment, the PCB is represented by an inductive and capacitive impedance component, and a transmission line model, as depicted in FIG. 2. After the impedance of the package and PCB is determined in operation 200, the on-die impedance of the integrated circuit is determined in operation 202. In one embodiment, the on-die impedance of the integrated circuit includes the capacitance of bump pad and the metal routing, as well as the ESD capacitance, as represented in FIG. 2.

In operation 204, the compensation inductor is sized according to the impedance values of the package and PCB, as determined in operation 200, and the on-die impedance of the integrated circuit including the bump pad and metal routing on the die, as determined in operation 202. In most cases, capacitance of the on-die ESD diode also needs to be considered. The method advances to operation 206, where an on-die compensation inductor is coupled to the bump pad and metal routing in a pi-configuration. In one embodiment, as illustrated in FIG. 2, the pi-configuration is formed by coupling one terminal of the inductor to the metal routing and coupling the other terminal of the on-die inductor to the bump pad. In operation 208, the design of the integrated circuit using the on-die compensation inductor is stored for manufacturing.

The method and apparatus described herein may be incorporated into any suitable circuit, including processors and programmable logic devices (PLDs). The PLDs can include programmable array logic (PAL), programmable logic arrays (PLAs), field programmable logic array (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the PLDs owned by the assignee.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit (IC) with an on-die compensation network, comprising:
   a compensation inductor of the IC, such that one terminal of the compensation inductor is coupled to a bump pad; and
   a metal layer underneath the compensation inductor, such that another terminal of the compensation inductor is coupled to the metal layer of the IC, wherein the metal layer routes input and output signals from the integrated circuit, and wherein the compensation inductor is coupled in a pi-configuration on the IC to compensate for capacitances of the bump pad and the metal layer.

2. The integrated circuit of claim 1, wherein the pi configuration further comprises:
the compensation inductor coupled to a capacitance of the bump pad and a capacitance of the metal layer underneath the compensation inductor.

3. The integrated circuit of claim 1, wherein a value of the compensation inductor is determined by a capacitance of the bump pad and the metal layer, and a capacitance and an inductance of a package and a printed circuit board coupled to the bump pad.

4. The integrated circuit of claim 1, wherein the compensation inductor is located underneath the bump pad.

5. The integrated circuit of claim 1, wherein the compensation inductor is implemented as a spiral inductor.

6. The integrated circuit of claim 1, wherein the compensation inductor is implemented using an existing metal layer closest to a metal layer of the bump pad.

7. The integrated circuit of claim 5, wherein the compensation inductor is implemented using a plurality of metal layers.

8. The integrated circuit of claim 1, wherein the pi-configuration minimizes return loss and insertion loss due to on-die, package, and printed circuit board parasitics.

9. The integrated circuit of claim 1, wherein the bump pad is coupled to one of a wirebond or a solder bump.

10. An electronic module with an on-die compensation network, comprising:
a printed circuit board;
a package coupled to the printed circuit board; and
an integrated circuit coupled to the package, such that the package transmits input and receives output from the printed circuit board to the integrated circuit, the integrated circuit having an on-die matching network compensating for an inductance and a capacitance of the printed circuit board and the package.

11. The electronic module of claim 10, wherein the on-die matching network further comprises:
a compensation inductor coupled in a pi-configuration to a bump pad and a metal layer underneath the compensation inductor.

12. The electronic module of claim 10, wherein the on-die matching network minimizes loss based on parasitics of the integrated circuit, the package, and the printed circuit board.

13. The electronic module of claim 11, wherein a value of the compensation inductor of the on-die matching network is determined by a capacitance of the bump pad and the metal layer, and a capacitance and an inductance of the package and the printed circuit board.

14. The electronic module of claim 11, wherein a diameter of the compensation inductor is less than a diameter of the bump pad.

15. The electronic module of claim 11, wherein the metal layer routes input and output from the integrated circuit to the bump pad.

16. A method of designing an integrated circuit with an on-die compensation network, comprising:
determining a capacitive and an inductive impedance value associated with a printed circuit board and a capacitive and an inductive impedance value associated with a package;
determining a capacitive impedance value associated with a bump pad of the integrated circuit, and an on-die capacitive impedance value associated with the integrated circuit;
calculating a size of a compensation inductor according to the impedance values of the printed circuit board, the package, the bump pad of the integrated circuit, and the integrated circuit;
coupling the compensation inductor to the bump pad and a metal layer of the integrated circuit in a pi-configuration, wherein the metal layer routes input and output from the integrated circuit; and
storing a design of the integrated circuit for manufacturing.

17. The method of claim 16, wherein coupling the compensation inductor further comprises:
calculating a number of turns of the compensation inductor based on the impedance values of the printed circuit board and the package.

18. The method of claim 16, wherein coupling the compensation inductor further comprises:
implementing the compensation inductor on a plurality of metal layers of the integrated circuit closest to the bump pad.

19. The method of claim 16, wherein coupling the compensation inductor further comprises:
placing the compensation inductor underneath the bump pad.

20. The method of claim 16, further comprising:
fabricating the compensation inductor with a diameter less than a diameter of a solder pad.

* * * * *